US008895882B2

(12) United States Patent
Lo et al.

(10) Patent No.: US 8,895,882 B2
(45) Date of Patent: Nov. 25, 2014

(54) TOUCH PANEL

(71) Applicant: HTC Corporation, Taoyuan County (TW)

(72) Inventors: Pi-Lin Lo, Taoyuan County (TW); Yen-Cheng Lin, Taoyuan County (TW); Yi-Fan Hsueh, Taoyuan County (TW); Te-Mu Chen, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 191 days.

(21) Appl. No.: 13/736,881

(22) Filed: Jan. 8, 2013

(65) Prior Publication Data

US 2013/0240341 A1 Sep. 19, 2013

Related U.S. Application Data

(60) Provisional application No. 61/611,005, filed on Mar. 14, 2012.

(51) Int. Cl.
*H03K 17/975* (2006.01)
*H03K 17/96* (2006.01)
*G06F 3/044* (2006.01)

(52) U.S. Cl.
CPC ............ *H03K 17/9622* (2013.01); *G06F 3/044* (2013.01)
USPC ............................ 200/600; 361/278; 174/250

(58) Field of Classification Search
CPC ........................... H03K 17/9622; G06F 3/044
USPC .......... 174/260, 250, 268; 361/277, 278, 280, 361/281, 287; 341/33; 200/600
See application file for complete search history.

(56) References Cited

U.S. PATENT DOCUMENTS 7,394,458 B2 * 7/2008 Lyon et al. ................... 345/173
7,880,479 B2 * 2/2011 Liao et al. .................... 324/679
(Continued)

FOREIGN PATENT DOCUMENTS

TW 201005597 2/2010
TW 201112085 4/2011

OTHER PUBLICATIONS

"Office Action of European Counterpart Application", issued on Jul. 4, 2013, p. 1-p. 3, in which the listed references were cited.

(Continued)

*Primary Examiner* — Lisa Lea Edmonds
*Assistant Examiner* — Keith Depew
(74) *Attorney, Agent, or Firm* — Jianq Chyun IP Office

(57) ABSTRACT

A touch panel includes a substrate and sensing units. Each sensing unit includes an electrode line, first electrode patterns, second electrode patterns and connecting lines. The electrode line extends along a second direction and has first openings arranged along the second direction and first breaches corresponding to the first openings. Each first breach connects the corresponding first opening and the exterior of the electrode line. The first electrode patterns are respectively disposed in the first openings. Each first electrode pattern has a second opening and a second breach connecting the second opening and the exterior of first electrode pattern. The second electrode patterns are respectively disposed in the second openings and respectively connected with the electrode line through the second breaches. The connecting lines are disposed on at least one side of the electrode line and connected with the corresponding first electrode pattern through the first breach.

20 Claims, 3 Drawing Sheets

(56) References Cited

U.S. PATENT DOCUMENTS

| | | | |
|---|---|---|---|
| 8,269,743 B2* | 9/2012 | Kuo et al. | 345/174 |
| 8,614,403 B2* | 12/2013 | Tanaka et al. | 200/600 |
| 8,698,001 B2* | 4/2014 | Yu et al. | 174/250 |
| 8,717,330 B2* | 5/2014 | Lu et al. | 345/174 |
| 2010/0214247 A1* | 8/2010 | Tang et al. | 345/173 |
| 2010/0220075 A1* | 9/2010 | Kuo et al. | 345/174 |
| 2011/0018815 A1* | 1/2011 | Han et al. | 345/173 |
| 2011/0090154 A1 | 4/2011 | Kuo | |
| 2011/0115718 A1* | 5/2011 | Hsieh et al. | 345/173 |
| 2011/0187676 A1 | 8/2011 | Chang et al. | |
| 2011/0291961 A1 | 12/2011 | Hsieh et al. | |
| 2012/0056820 A1* | 3/2012 | Corbridge | 345/173 |
| 2013/0088448 A1* | 4/2013 | Seo et al. | 345/173 |
| 2013/0241845 A1* | 9/2013 | Hsu et al. | 345/173 |
| 2014/0027261 A1* | 1/2014 | Yeh et al. | 200/600 |
| 2014/0035864 A1* | 2/2014 | Chang et al. | 345/174 |

OTHER PUBLICATIONS

"Office Action of Taiwan Counterpart Application", issued on Jun. 24, 2014, p. 1-p. 7, in which the listed references were cited.

* cited by examiner

TOUCH PANEL

CROSS-REFERENCE TO RELATED APPLICATION

This application claims the priority benefits of U.S. provisional application Ser. No. 61/611,005, filed on Mar. 14, 2012. The entirety of the above-mentioned patent application is hereby incorporated by reference herein and made a part of this specification.

BACKGROUND OF THE APPLICATION

1. Field of the Application

The application relates to a touch panel, and more particularly, to a capacitive touch panel.

2. Description of Related Art

As information technology, wireless mobile communication and information appliances have been rapidly developed and applied, to achieve more convenience, more small volume, light weight and more user-friendly designs, various information products have changed from using conventional input devices such as key boards or mice to using touch panels.

Based on different sensing types, touch panels can be categorized into resistive touch panels, capacitive touch panels, optical touch panels, acoustic-wave touch panels and electromagnetic touch panels. In comparison to other touch panels, the capacitive touch panels are characterized by short response speed, favorable reliability, high definition, and so on. Therefore, the capacitive touch panels are widely used in the portable electronic products.

The capacitive touch panel uses multiple line-shaped electrodes that intersect each other to form a sensing array so as to achieve surface sensing. When a user touches the touch panel with a finger, the touch panel determines the position touched by the finger according to the capacitance variation on the sensing array. The sensitivity of a capacitive touch panel depends on the coupling capacitance between the electrodes. Thus, how to improve the coupling capacitance and provide a good touch sensing quality to users is definitely an issue worth for further discussion.

SUMMARY OF THE APPLICATION

The application is directed to a touch panel having a favorable touch sensing quality.

The application provides a touch panel including a substrate and a plurality of sensing units. The substrate has a surface, and the sensing units are arranged in parallel along a first direction on the surface. Each of the sensing units includes an electrode line, a plurality of first electrode patterns, a plurality of second electrode patterns and a plurality of connecting lines. The electrode line extends along a second direction, and the first direction intersects the second direction. The electrode line has a plurality of first openings arranged along the second direction and a plurality of first breaches corresponding to the first openings. Each of the first breaches connects the corresponding first opening and the exterior of the electrode line. The first electrode patterns are respectively disposed in the first openings and insulated with the electrode line, wherein each of the first electrode patterns has a second opening and a second breach which connects the second opening and the exterior of the first electrode pattern. The second electrode patterns are respectively disposed in the second openings and insulated with the first electrode patterns, wherein the second electrode patterns are respectively connected to the electrode line through the second breaches. The connecting lines are disposed on at least one side of the electrode line and extend along the second direction, wherein the connecting lines are connected with their corresponding first electrode pattern through the first breaches.

In the sensing unit of the touch panel of the application, the first electrode pattern is disposed in the first opening of the electrode line, and the second electrode pattern is disposed in the second opening of the first electrode pattern. With such configuration, the coupling capacitance between the electrodes is increased so that the sensitivity of the touch panel is improved and a favorable touch sensing quality is provided to the touch panel users.

Several exemplary embodiments accompanied with figures are described in detail below to further describe the application in details.

BRIEF DESCRIPTION OF THE DRAWINGS

The accompanying drawings are included to provide a further understanding of the application, and are incorporated in and constitute a part of this specification. The drawings illustrate exemplary embodiments of the application and, together with the description, serve to explain the principles of the application.

DETAILED DESCRIPTION OF DISCLOSED EXEMPLARY EMBODIMENTS

Figure 1:
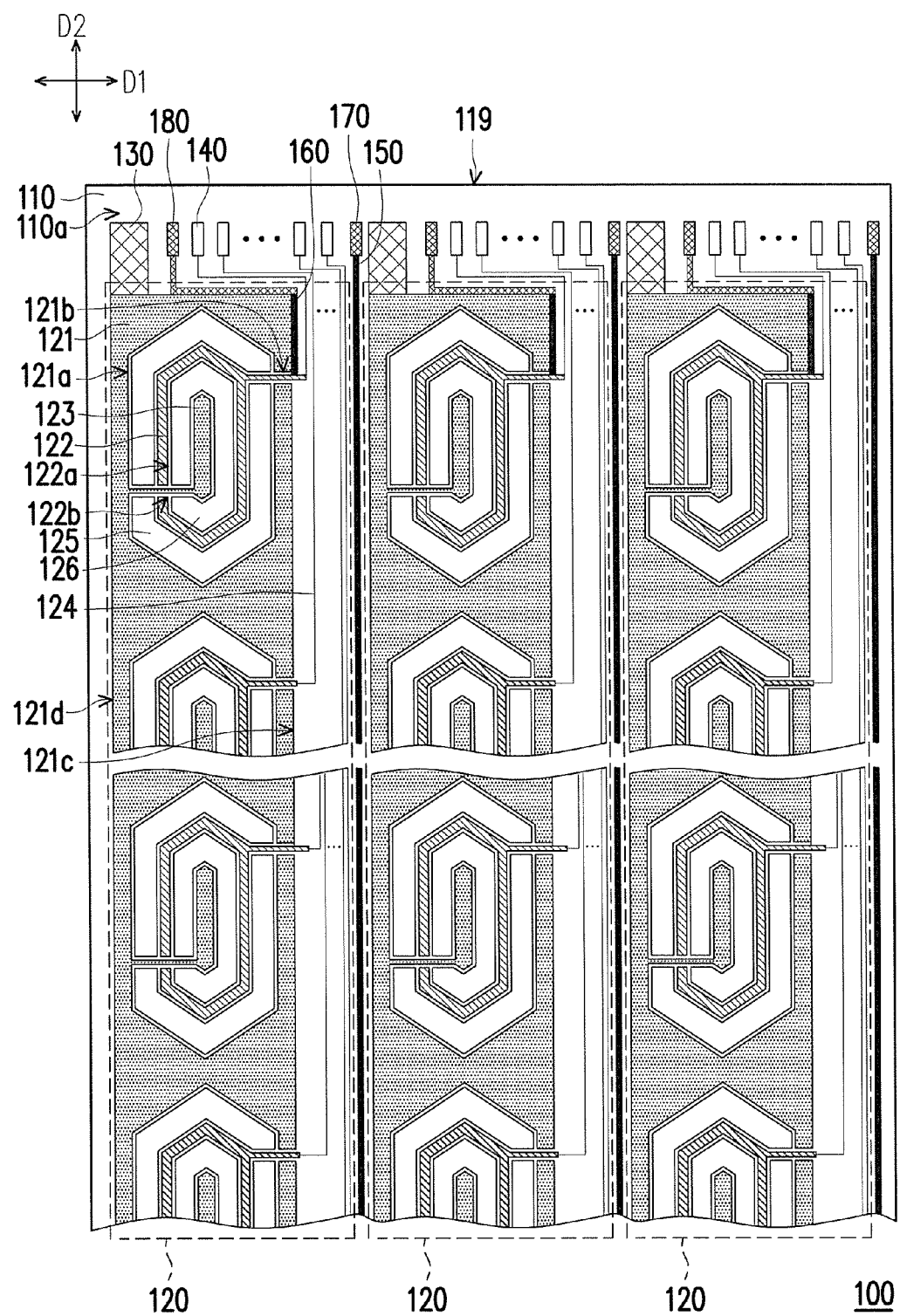
FIG. 1 is a schematic view of a touch panel according to an exemplary embodiment of the application.

FIG. 1 is a schematic view of a touch panel according to an exemplary embodiment of the application. The touch panel 100 includes a substrate 110 and a plurality of sensing units 120. The substrate 110 has a surface 110a, and the sensing units 120 are arranged in parallel along a first direction D1 on the surface 110a. Each of the sensing units 120 includes an electrode line 121, a plurality of first electrode patterns 122, a plurality of second electrode patterns 123 and a plurality of connecting lines 124. The electrode line 121 extends along a second direction D2, and the first direction D1 intersects the second direction D2. In the embodiment, the touch panel 100 including three sensing units 120 is taken as an example for illustration, but the application is not limited thereto. Those skilled in the art can properly adjust the quantity of the sensing units 120 according to actual requirements.

As shown in FIG. 1, the electrode line 121 has a plurality of first openings 121a arranged along the second direction D2 and a plurality of first breaches 121b corresponding to the first openings 121a. Each of the first breaches 121b connects the corresponding first opening 121a and the exterior of the electrode line 121. The first electrode patterns 122 are respectively disposed in the first openings 121a and insulated with the electrode line 121. Each of the first electrode patterns 122 has a second opening 122a and a second breach 122b which connects the second opening 122a and the exterior of the first electrode pattern 122. The second electrode patterns 123 are respectively disposed in the second openings 122a and insulated with the first electrode patterns 122, wherein the second electrode patterns 123 are respectively connected with the electrode line 121 through the second breaches 122b. The connecting lines 124 are disposed on the first side 121c of the electrode line 121 and extend along the second direction D2, wherein the connecting lines 124 are connected with the corresponding first electrode pattern 122 through the first breaches 121b.

In the embodiment, since the first electrode patterns 122 are disposed in each corresponding first opening 121a of the electrode line 121, the coupling capacitance between the first electrode patterns 122 and the electrode line 121 can be increased. Similarly, since the second electrode patterns 123 are disposed in each corresponding second opening 122a of the first electrode patterns 122, the coupling capacitance between the second electrode patterns 123 and the first electrode patterns 123 can be increased. If the coupling capacitance between the electrodes of the touch panel 100 is increased, the sensitivity of the touch panel 100 can be thereby improved. In the embodiment, the first electrode pattern 122 is in an annular shape with a second breach 122b, so that the second electrode pattern 123 located in the first electrode pattern 122 can be connected with the electrode line 121 through the second breach 122b. The annular design increases the range of the first electrode pattern 122 to enclose the second electrode pattern 123, thus the coupling capacitance between the first electrode pattern 122 and the second pattern 123 is further improved.

In the embodiment, each of the sensing units 120 further includes a plurality of first dummy patterns 125 and a plurality of second dummy patterns 126. The first dummy patterns 125 are respectively disposed in the first breaches 121b and located between the electrode line 121 and the first electrode patterns 122. The second dummy patterns 126 are respectively disposed in the second openings 122a, wherein each of the second dummy patterns 126 is located between the corresponding first electrode pattern 122 and the corresponding second electrode pattern 123. As illustrated in FIG. 1, each first dummy pattern 125 is in an annular shape, and each second dummy pattern 126 is in an annular shape.

If the distance between the electrode line 121 and the first electrode pattern 122 is too small, the coupling capacitance generated by the electrode line 121 and the first electrode pattern 122 may be too large, and then the sensitivity of the touch sensing operation may be affected. Therefore, an appropriate distance is kept between the electrode line 121 and the first electrode pattern 122. However, the distance may affect the transmitting uniformity of the touch panel 100. The first dummy pattern 125 located between the electrode line 121 and the first electrode pattern 122 can improve the poor transmitting uniformity of the touch panel 100. If the distance between the first electrode pattern 122 and the second electrode pattern 123 is too small, the coupling capacitance generated by the first electrode pattern 122 and the second electrode pattern 123 may be too large, and then the sensitivity of the touch sensing operation may be affected. Therefore, an appropriate distance is kept between the first electrode pattern 122 and the second electrode pattern 123. Similarly, the second dummy pattern 126 located between the first electrode pattern 122 and the second electrode pattern 123 can improve the poor transmitting uniformity of the touch panel 100 due to the distance.

Referring to FIG. 1, in the embodiment, the touch panel 100 includes a plurality of first pads 130 and a plurality of second pads 140. The first pads 130 and the second pads 140 are located on the surface 110a of the substrate 110 and adjacent to the first end 119 of the substrate 110. Each of the first pads 130 is connected with the corresponding electrode line 121, and each of the second pads 140 is connected with the corresponding connecting line 124. As shown in FIG. 1, the first pads 130 and the second pads 140 are arranged along the first direction D1. In addition, the touch panel 100 includes a plurality of first ground lines 150 disposed on the surface 110a of the substrate 110 and respectively extending along the second direction D2. In the embodiment, a first ground line 150 is between every two adjacent sensing units 120, thus the generating of signal noise between the two adjacent sensing units 120 can be prevented. Moreover, in the embodiment, the touch panel 100 further includes a plurality of first ground pads 170 located on the surface 110a of the substrate 110 and adjacent to the first end 119 of the substrate 110. Each of the first ground pads 170 is connected with the corresponding first ground line 150.

In the embodiment, each of the sensing units 120 further includes a second ground line 160 disposed on the surface 110a of the substrate 110 and extending along the second direction D2. The second ground line 160 is between the electrode line 121 and the connecting line 124 adjacent to the electrode line 121, thus the generating of signal noise between the electrode line 121 and the adjacent connecting line 124 can be prevented. In the embodiment, the touch panel 100 further includes a plurality of second ground pads 180 located on the surface 110a of the substrate 110 and adjacent to the first end 119 of the substrate 110. Each of the second ground pads 180 is connected with the corresponding second ground line 160.

In the embodiment, since the first electrode patterns 122 are disposed in the first openings 121a of the electrode line 121 and the second electrode patterns 123 are disposed in the second openings 122a of the first electrode patterns 122, the coupling capacitance between the electrodes can be increased so as to improve the sensitivity. In addition, the first dummy pattern 125 and the second dummy pattern 126 can improve the poor transmitting uniformity of the touch panel 100. Additionally, the first ground line 150 can prevent the generating of signal noise between each of the sensing units 120, and the second ground line 160 can prevent the generating of signal noise between the electrode line 121 and the adjacent connecting line 124. Accordingly, the touch panel 100 of the embodiment can provide users a favorable touch sensing quality.

In the embodiment, the first electrode patterns 122, the first dummy patterns 125 and the second dummy patterns 126 are in annular shapes. In a sensing unit 120, the configuration of the second electrode pattern 123, the second dummy pattern 126, the first electrode pattern 122, and then the first dummy pattern 125 is in a manner of a ring enclosing another ring, from inside to outside. As shown in FIG. 1, a plurality of such configurations of a ring enclosing another ring are arranged along the second direction D2 and located at the center of the electrode line 121. Such configuration not only increases the coupling capacitance between the electrodes, but also provides uniform output signals when the touch panel 100 is operated. Furthermore, by disposing the aforementioned component at the center of the electrode line 121 also facilitates improving accuracy and linearity performance of the touch panel 100. In the embodiment, the first openings 121a and the second electrode patterns 123 are hexagons, wherein the second electrode 123 is in a corresponding annular shape, but the application is not limited thereto. The first openings 121a and the second electrode patterns 123 can be other polygons, wherein the second electrode patterns 123 is in another annular shape corresponding to the polygon.

It should be mentioned that, in the embodiment, the first breach 121b of each of the sensing units 120 is located on the first side 121c of the electrode line 121, and the connecting lines 124 are also located on the first side 121c of the electrode line 121, but the application is not limited thereto. In other embodiments, a portion of the first breach 121b of each of the sensing units 120 can be located on the first side 121c, and the other portion of the first breach 121b of each of the sensing units 120 can be located on a second side 121d opposite to the first side 121c. With such configuration, a portion of the connecting lines 124 may be disposed on the first side 121c, and the other portion of the connecting lines 124 may be disposed on the second side 121d for effective use of the layout space of the touch panel 100.

Figure 2:
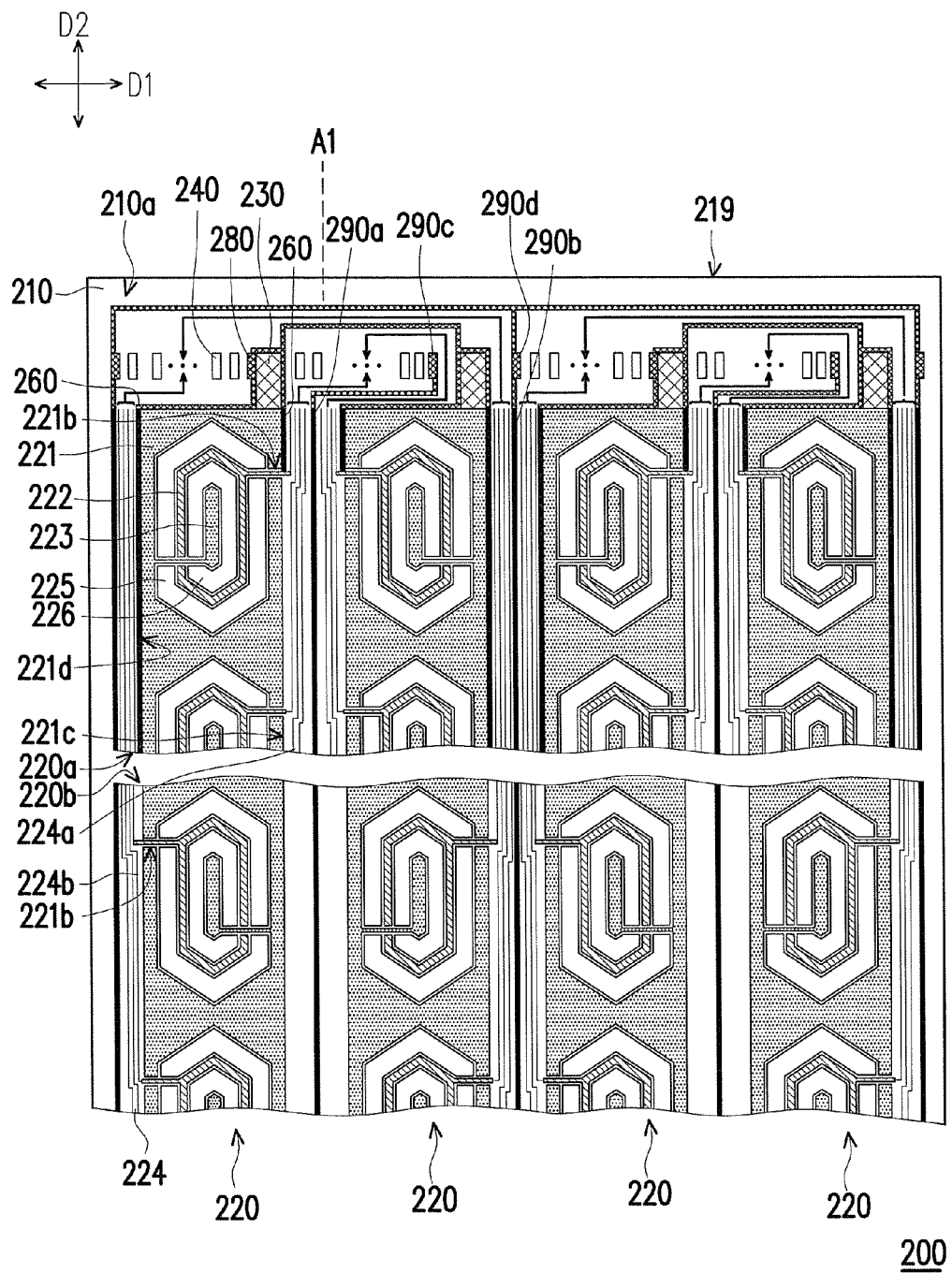
FIG. 2 is a schematic view of a touch panel according to another exemplary embodiment of the application.

FIG. 2 is a schematic view of a touch panel according to another exemplary embodiment of the application. The touch panel 200 includes a substrate 210 and a plurality of sensing units 220. The substrate 210 has a surface 210a, and the sensing units 220 are arranged in parallel along a first direction D1 on the surface 210a. Each of the sensing units 220 includes an electrode line 221, a plurality of first electrode patterns 222, a plurality of second electrode patterns 223, a plurality of connecting lines 224, a plurality of first dummy patterns 225 and a plurality of second dummy patterns 226. The electrode line 221 extends along a second direction D2, and the first direction D1 intersects the second direction D2. In the embodiment, the touch panel 200 including four sensing units 220 is taken as an example for illustration, but the application is not limited thereto. Those skilled in the art can properly adjust the quantity of the sensing units 220 according to actual requirements.

The present embodiment is substantially similar to the embodiment mentioned above, the main difference between thereof is: in each of the sensing units 120, a portion of the first breaches 221b and the corresponding portion of the connecting lines 224 are located on a side of the electrode line 221, and the other portion of the first breaches 221b and the corresponding portion of the connecting lines 224 are located on the other side of the electrode line 221. In addition, with such configuration, in the embodiment, the connecting manner of the connecting lines 224 and the second pads 240, the quantity and disposing manner of the ground lines and the connecting manner of the ground lines and the ground pads are adjusted to simplify the circuit layout and retrench the required layout space of the first end 219 of the substrate 210. The following description omits the detailed descriptions relevant to similar portions of the technology of the present embodiment and the embodiment of FIG. 1. The omitted description can be referred to the aforementioned embodiment, and it is not repeated herein.

Referring to FIG. 2, the first breaches 221b of a first portion 220a of each of the sensing units 220 are located on the first side 221c of the electrode line 221, the first breaches 221b of a second portion 220b of each of the sensing units 220 are located on the second side 221d of the electrode line 221, and the first side 221c is opposite to the second side 221d. The connecting lines 224a of the first portion 220a of each of the sensing units 220 are located on the first side 221c and connected with the corresponding first electrode patterns 222 of the first portion 220a through the first breaches 221b of the first portion 220a. The connecting lines 224b of the second portion 220b of each of the sensing units 220 are located on the second side 221d and connected with the corresponding first electrode patterns 222 of the second portion 220b through the first breaches 221b of the second portion 220b.

In the embodiment, the touch panel 200 further includes a plurality of first pads 230 and a plurality of second pads 240. The first pads 230 and the second pads 240 are located on the surface 210a of the substrate 210 and adjacent to the first end 219 of the substrate 210. Each of the first pads 230 is connected with the corresponding electrode line 221, and each of the second pads 240 is connected with the corresponding connecting line 224. In addition, each of the sensing units 220 further includes two second ground lines 260 disposed on the surface 210a of the substrate 210 and extending along the second direction D2. In the same sensing unit 220, the two second ground lines 260 are respectively disposed on the first side 221c and the second side 221d of the electrode line 221, so that the generating of signal noise between the electrode line 221 and the connecting lines 224 located two sides of the electrode line 221 can be prevented. In the embodiment, the touch panel 200 further includes a plurality of second ground pads 280 located on the surface 210a of the substrate 210 and adjacent to the first end 219 of the substrate 210. Each of the second ground pads 280 is connected with the corresponding second ground line 260.

In the embodiment, every two adjacent sensing units 220 are disposed in a mirror image manner relative to a symmetrical axis A1 which extends along the second direction D2. The connecting lines 224 of the two adjacent sensing units 220 commonly use the same group of the second pads 240, and the second ground lines 260 of the two adjacent sensing units 220 commonly use the same second ground pad 280. The advantage of commonly using the second pads 240 is using the same pad output signal, and cooperating with commonly using the second ground pad 280 the quantity of the pads of the touch panel 200 can be effectively reduced. If the quantity of the pads of the touch panel 200 is decreased, the wire winding area of the pad region of the touch panel may be reduced. Moreover, when the touch panel 200 includes a flexible printed circuit board (not shown) for transmitting signals of the pads, the wire winding area of the flexible printed circuit board may also be reduced. As shown in FIG. 2, the first pads 230, the second pads 240 and the second ground pads 280 are arranged along the first direction D1, and each of the second ground pads 280 is located between each corresponding first pad 230 and the second pad 240 adjacent to the first pad 230. As such, the signal noise between the first pads 230 and the second pads 240 can be prevented.

Referring to FIG. 2, in the embodiment, the touch panel 200 further includes a plurality of third ground lines 290a disposed on the surface 210a of the substrate 210 and respectively extending along the second direction D2. A third ground line 290a is between every two sensing units 220 which are disposed in a mirror image mariner. The third ground line 290a can prevent the signal noise between the two sensing units 220 which are disposed in a mirror image manner. In addition, the touch panel 200 further includes a plurality of third ground pads 290c located on the surface 210a of the substrate 210 and adjacent to the first end 219 of the substrate 210. Each of the third ground pads 290c is connected with the corresponding third ground line 260a.

Referring to FIG. 2, in the embodiment, the touch panel 200 further includes a plurality of fourth ground lines 290b disposed on the surface of the substrate and respectively extending along the second direction D2. Any two adjacent sensing units 220 disposed in the mirror image manner and another two adjacent sensing units 220 disposed in a mirror image manner are provided with one of the fourth ground lines 290b there between. The fourth ground pad 290d can prevent the signal noise between the group of two sensing units 220 which are disposed in a mirror image manner and the other group of two sensing units 220 which are disposed in a mirror image manner. In addition, the touch panel 200 further includes a plurality of fourth ground pads 290d located on the surface 210a of the substrate 210 and adjacent to the first end 219 of the substrate 210. Each of the fourth ground pads 290d is connected with the corresponding fourth ground line 290b.

In the embodiment, the sensing units 220 can be categorized into the first portion 220a in which the first breaches 221b are located on the first side 221c and the second portion 220b in which the first breaches 221b are located on the second side 221d, and every two adjacent sensing units 220 are disposed in a mirror image manner. With such aforementioned configuration, the connecting line 224 of the two adjacent sensing units 220 may commonly use the same group of second pads 240, and the second ground line 260 of the two adjacent sensing units 220 may commonly use the same second ground pad 280. As such, the quantity of pads of the touch panel 200 can be reduced. In addition, the configuration of the second ground lines 260, the third ground lines 290a and the fourth ground lines 290b can prevent the signal noise between the electrode line 221 and the connecting lines 224, or the signal noise between the electrode lines 221 and the electrode line 221. With the cooperation of design of the electrode line 221, the first electrode patterns 222, the second electrode patterns 223, the first dummy patterns 225 and the second dummy patterns 226, the touch sensing quality of the touch panel 200 is effectively improved in the embodiment.

Figure 3:
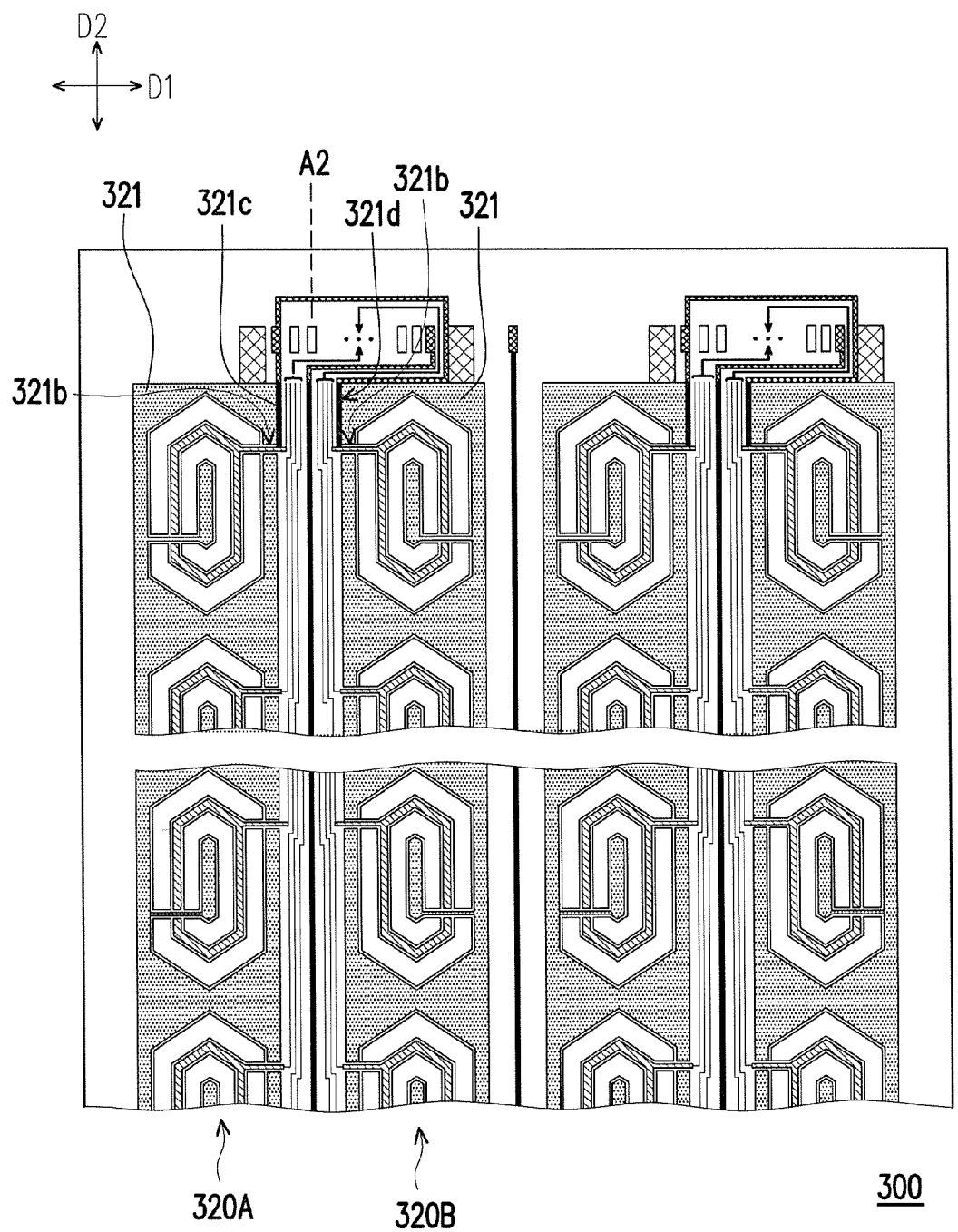
FIG. 3 is a schematic view of a touch panel according to another exemplary embodiment of the application.

FIG. 3 is a schematic view of a touch panel according to another exemplary embodiment of the application. The embodiment of FIG. 3 is substantially similar to the embodiment of FIG. 2. The main difference is: the first breaches 321b of the two adjacent electrode lines 321 are opposite to each other. Referring to FIG. 3, in the embodiment, every two adjacent sensing units 320A, 320B are disposed in a mirror image manner relative to a symmetrical axis A2 which extends along the second direction D2. The first breaches 321b of the sensing unit 320A are located on the first side 321c of the first electrode line 321, and the first breaches 321b of the sensing unit 320B are located on the second side 321d of the first electrode line 321.

In light of the foregoing, in the sensing unit of the touch panel of the application, the first electrode pattern is disposed in the first opening of the electrode line, and the second electrode pattern is disposed in the second opening of the first electrode pattern. With such configuration, the coupling capacitance between the electrodes is increased so that the sensitivity of the touch panel is improved and a favorable touch sensing quality is provided to the touch panel users. In addition, the first dummy pattern disposed between the electrode line and the first electrode pattern and the second dummy pattern disposed between the first electrode pattern and the second electrode pattern can improve the poor transmitting uniformity of the touch panel. Moreover, the configuration of each ground line can prevent the signal noise between the electrode line and the connecting line, or the signal noise between the electrode lines. Accordingly, the touch panel of the application has a favorable touch sensing quality.

Furthermore, in each of the sensing units, all of the first breaches can be located on the same side of the electrode line; or alternatively, a portion of the first breaches are located on a side of the electrode line while the other portion of the first breaches are located on the other side of the electrode line. Therefore, the touch panel has a favorable flexibility for design. When the first breaches are located on different sides of the electrode line, the adjacent sensing units can be disposed in a mirror image manner. In addition, the connecting line of the two adjacent sensing units may commonly use the same group of second pads, and the second ground line of the two adjacent sensing units may commonly use the same second ground pad. As such, the quantity of pads of the touch panel can be reduced. Moreover, with such symmetrical configuration, the connecting manner of the connecting lines and the second pads, the quantity and disposing manner of the ground lines and the connecting manner of the ground lines and the ground pads can be adjusted, so that the layout is simplified and the required layout space of the first end of the substrate is retrenched.

It will be apparent to those skilled in the art that various modifications and variations can be made to the structure of the disclosure without departing from the scope or spirit of the application. In view of the foregoing, it is intended that the disclosure cover modifications and variations of this application provided they fall within the scope of the following claims and their equivalents.

What is claimed is:

1. A touch panel comprising:
   a substrate having a surface; and
   a plurality of sensing units arranged along a first direction on the surface, each of the sensing units comprising:
      an electrode line extending along a second direction, wherein the first direction intersects the second direction, the electrode line has a plurality of first openings arranged along the second direction and a plurality of first breaches corresponding to the first openings, and each of the first breaches connects each corresponding first opening and an exterior of the electrode line;
      a plurality of first electrode patterns respectively disposed in the first openings and insulated with the electrode line, wherein each of the first electrode patterns has a second opening and a second breach which connects the second opening and an exterior of the first electrode pattern;
      a plurality of second electrode patterns respectively disposed in the second openings and insulated with the first electrode patterns, wherein the second electrode patterns are respectively connected with the electrode line through the second breaches; and
      a plurality of connecting lines disposed on at least one side of the electrode line and extending along the second direction, wherein the connecting lines are connected with their corresponding first electrode pattern through the first breaches.

2. The touch panel as claimed in claim 1, wherein each of the first electrode patterns is in an annular shape.

3. The touch panel as claimed in claim 1, wherein each of the sensing units further comprises:
   a plurality of first dummy patterns respectively disposed in the first openings, wherein each of the first dummy patterns is located between the electrode line and the corresponding first electrode pattern.

4. The touch panel as claimed in claim 3, wherein each of the first dummy patterns is in an annular shape.

5. The touch panel as claimed in claim 1, wherein each of the sensing units further comprises:
   a plurality of second dummy patterns respectively disposed in the second openings, wherein each of the second dummy patterns is located between the corresponding first electrode pattern and the corresponding second electrode pattern.

6. The touch panel as claimed in claim 5, wherein each of the second dummy patterns is in an annular shape.

7. The touch panel as claimed in claim 1, wherein the first breaches of a first portion of each of the sensing units are located at a first side of the electrode line, the first breaches of a second portion of each of the sensing units are located at a second side of the electrode line, the first side is opposite to the second side, the connecting lines of the first portion of each of the sensing units are located at the first side and connected with the corresponding first electrode patterns of the first portion through the first breaches of the first portion, and the connecting lines of the second portion of each of the sensing units are located at the second side and connected with the corresponding first electrode patterns of the second portion through the first breaches of the second portion.

8. The touch panel as claimed in claim 1, further comprising:
   a plurality of first pads located on the surface of the substrate and adjacent to an end of the substrate, wherein each of the first pads is connected with the corresponding electrode line; and
   a plurality of second pads located on the surface of the substrate and adjacent to the end of the substrate, wherein each of the second pads is connected with the corresponding connecting line.

9. The touch panel as claimed in claim 8, wherein every two adjacent sensing units are disposed in a minor image manner relative to a symmetrical axis which extends along the second direction, and the connecting lines of the two adjacent sensing units commonly use a same group of the second pads.

10. The touch panel as claimed in claim 8, wherein the first pads and the second pads are arranged along the first direction.

11. The touch panel as claimed in claim 1, further comprising:
    a plurality of first ground lines disposed on the surface of the substrate and respectively extending along the second direction, wherein any two adjacent sensing units is provided with one of the first ground lines there between.

12. The touch panel as claimed in claim 11, further comprising:
    a plurality of first ground pads located on the surface of the substrate and adjacent to the end of the substrate, wherein each of the first ground pads is connected with the corresponding first ground line.

13. The touch panel as claimed in claim 8, wherein each of the sensing units further comprises:
    a second ground line disposed on the surface of the substrate and extending along the second direction, wherein the second ground line is located between the electrode line and the connecting line adjacent to the electrode line.

14. The touch panel as claimed in claim 13, further comprising:
    a plurality of second ground pads located on the surface of the substrate and adjacent to the end of the substrate, wherein each of the second ground pads is connected with the corresponding second ground line.

15. The touch panel as claimed in claim 14, wherein every two adjacent sensing units are disposed in a mirror image manner relative to a symmetrical axis which extends along the second direction, the connecting lines of the two adjacent sensing units commonly use a same group of the second pads, and the second ground lines of the two adjacent sensing units commonly use a same second ground pad.

16. The touch panel as claimed in claim 15, wherein the first pads, the second pads and the second ground pads are arranged along the first direction, and each of the second ground pads is located between each corresponding first pad and the second pad adjacent to the first pad.

17. The touch panel as claimed in claim 15, further comprising:
    a plurality of third ground lines disposed on the surface of the substrate and respectively extending along the second direction, wherein any two adjacent sensing units which are disposed in the mirror image manner is provided with one of the third ground lines there between.

18. The touch panel as claimed in claim 17, further comprising:
    a plurality of third ground pads located on the surface of the substrate and adjacent to the end of the substrate, wherein each of the third ground pads is connected with the corresponding third ground line.

19. The touch panel as claimed in claim 17, further comprising:
    a plurality of fourth ground lines disposed on the surface of the substrate and respectively extending along the second direction, wherein any two adjacent sensing units disposed in the mirror image manner and another two adjacent sensing units disposed in a mirror image manner are provided with one of the fourth ground lines there between.

20. The touch panel as claimed in claim 19, further comprising:
    a plurality of fourth ground pads located on the surface of the substrate and adjacent to the end of the substrate, wherein each of the fourth ground pads is connected with the corresponding fourth ground line.

* * * * *